(12) United States Patent
Salter et al.

(10) Patent No.: US 7,447,060 B2
(45) Date of Patent: Nov. 4, 2008

(54) MRAM MEMORY CONDITIONING

(75) Inventors: Eric John Salter, Scottsdale, AZ (US); Mark F. Deherrera, Chandler, AZ (US); Thomas H. Lee, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 14 days.

(21) Appl. No.: 11/678,346

(22) Filed: Feb. 23, 2007

(65) Prior Publication Data

US 2008/0205122 A1    Aug. 28, 2008

(51) Int. Cl.
- *G11C 11/00* (2006.01)
- *G11C 11/14* (2006.01)
- *G11C 11/15* (2006.01)
- *G11C 29/00* (2006.01)

(52) U.S. Cl. .................... 365/158; 365/171; 365/173; 365/201

(58) Field of Classification Search ............ 365/158, 365/171, 173, 201
See application file for complete search history.

(56) References Cited

U.S. PATENT DOCUMENTS

| | | | |
|---|---|---|---|
| 6,104,633 A * | 8/2000 | Abraham et al. | 365/171 |
| 6,452,764 B1 * | 9/2002 | Abraham et al. | 365/173 |
| 6,861,318 B2 | 3/2005 | Murthy et al. | |
| 6,925,000 B2 * | 8/2005 | Sussner | 365/158 |
| 7,072,208 B2 * | 7/2006 | Min et al. | 365/158 |
| 7,345,911 B2 * | 3/2008 | Min et al. | 365/158 |
| 7,355,884 B2 * | 4/2008 | Nakayama et al. | 365/158 |

FOREIGN PATENT DOCUMENTS

| | | |
|---|---|---|
| JP | 07094717 A | 4/1995 |
| JP | 2003-060202 A | 2/2003 |

OTHER PUBLICATIONS

PCT Search Report, PCT/US2008/051844, dated Jan. 24, 2008.

* cited by examiner

*Primary Examiner*—Trong Phan
(74) *Attorney, Agent, or Firm*—Ingrassia, Fisher & Lorenz, P.C.

(57) ABSTRACT

According to an example embodiment, a method (500) includes applying a magnetic field to an array of Magnetic Tunnel Junction (MTJ) bits, a magnitude of the magnetic field sufficient to eliminate a stuck-at-mid condition exhibited by one of the MTJ bits without causing other ones of the MTJ bits to develop the stuck-at-mid condition.

20 Claims, 2 Drawing Sheets

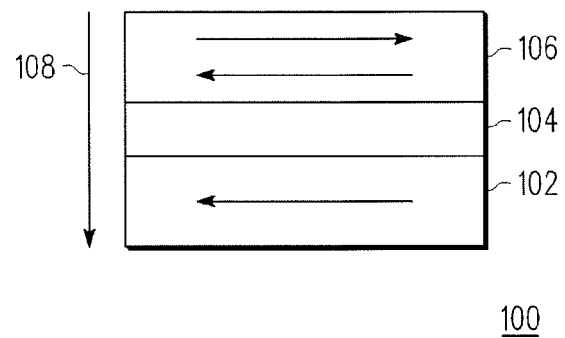
FIG. 1
(CONVENTIONAL)
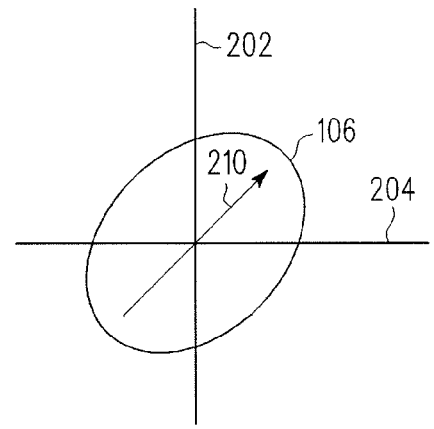
FIG. 2
(CONVENTIONAL)
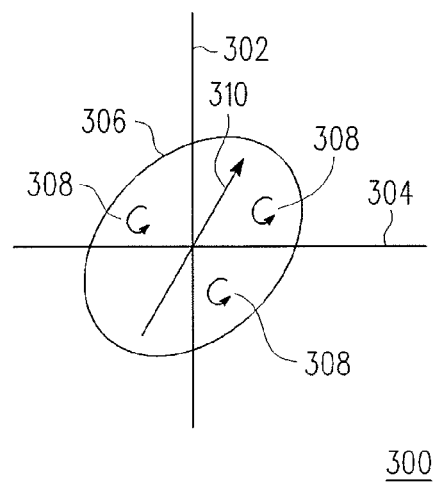
FIG. 3
(CONVENTIONAL)
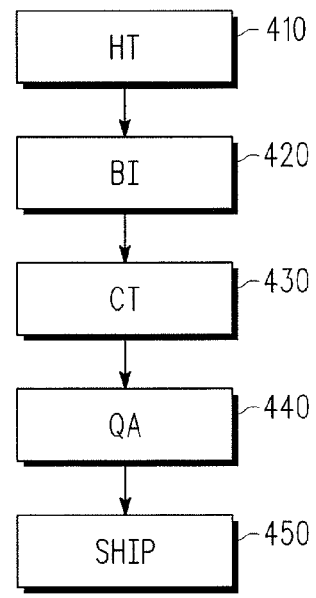
FIG. 4
(CONVENTIONAL)

MRAM MEMORY CONDITIONING

FIELD

This disclosure relates generally to Magnetic Random Access Memory (MRAM) devices, and more particularly to memory conditioning of MRAM devices.

BACKGROUND

FIG. 1 is a simplified sectional diagram illustrating a Magnetic Tunnel Junction (MTJ) 100 of a conventional MRAM bit cell. In addition to the MTJ 100, the conventional MRAM bit cell has a transistor (not shown). With reference to FIG. 1, the MTJ 100 includes a fixed magnetic layer 102, a tunnel barrier layer 104, and a free magnetic layer 106. During operation of the MRAM bit cell, the magnetic moment (indicated by the unidirectional arrow) of the fixed magnetic layer 102 remains oriented in one direction. Conversely, the magnetic moment of the free magnetic layer 106 is designed to be either at 0° or 180° relative to the magnetic moment of the fixed magnetic layer 102. The orientation of the magnetic moment of the free magnetic layer 106 determines the state of the MRAM bit cell, as the resistance to a read current 108 through the MTJ 100 will be different when at 0° than at 180°.

FIG. 2 is a simplified plan diagram further illustrating the MTJ 100 of FIG. 1. As illustrated in FIG. 2, the MTJ 100 exhibits a generally oval shape. Two write lines 202, 204 are disposed substantially perpendicular to each other and are vertically arranged so that the MTJ 100 is between them. The write lines 202, 204 provide the current pulses that generate the magnetic field that orients the magnetic moment 210 of the free magnetic layer 106 in either the 0° or 180° state. In FIG. 2, the magnetic moment 210 of the free magnetic layer 106 is arbitrarily shown at the 0° state.

FIG. 3 is a simplified plan diagram illustrating another conventional MTJ 300 that exhibits a "stuck-at-mid" problem. The MTJ 300 has the same basic construction as the MTJ 100 of FIG. 1 and FIG. 2. The write lines 302, 304 of FIG. 3 are similar to the two write lines 202, 204 of FIG. 2, and the free magnetic layer 306 has a similar shape as the free magnetic layer 106 of FIG. 2. As illustrated in FIG. 3, vortices 308 that have unstable magnetic moments exist within the free magnetic layer 306 of the MTJ 300. The presence of the vortices 308 cause the predominant magnetic moment 310 of the free magnetic layer 306 to be aligned in a state that is neither 0° nor 180°. This causes the resistance of the MTJ 300 to be at an intermediate value between the "0" and "1" resistance values. The MTJ 300 is stuck because the current pulses that generate the write magnetic fields are unable to break the unstable magnetic moments of the vortices 308 and align them to the 0° or 180° state, hence the term "stuck-at-mid." Because of the unstable vortices 308, it is difficult to determine whether the MTJ bit cell associated with MTJ 300 is to be read as a "0" or "1." In an array of MTJ bit cells, there is typically a distribution of cells that exhibit this stuck-at-mid problem.

FIG. 4 is a flow diagram that illustrates processes included in a conventional method 400 of testing an assembled MRAM device. Method 400 includes a Hot Test (HT) 410, followed by a Burn-In (BI) test 420, and a Cold Test (CT) 430. After CT 430, additional Quality Assurance (QA) tests are performed at process 440. Assuming the MRAM device passes all tests 410-440 satisfactorily, it will be shipped at process 450. During Burn-In 420, a defective MRAM device is forced to fail by operating it for an extended period of time at voltages and temperatures that are elevated relative to maximum levels specified for the MRAM device.

Unfortunately, the elevated voltage and temperature conditions used during the Burn-In 420 can exacerbate the stuck-at-mid problem. The stuck-at-mid problem may also be caused by close proximity to external magnetic fields that can disturb the magnetic moment, or by elevated temperatures that occur during manufacturing of the MTJ. Example embodiments address these and other disadvantages of the conventional art.

BRIEF DESCRIPTION OF THE DRAWINGS

Example embodiments will hereinafter be described in conjunction with the following drawing figures, wherein like numerals denote like elements, and wherein:

FIG. 1 is a simplified sectional diagram illustrating a Magnetic Tunnel Junction (MTJ) of a conventional MRAM bit cell;

FIG. 2 is a simplified plan diagram further illustrating the MTJ of FIG. 1;

FIG. 3 is a simplified plan diagram illustrating another conventional MTJ that exhibits a "stuck-at-mid" problem;

FIG. 4 is a flow diagram that illustrates processes included in a conventional method of testing an assembled MRAM device;

DETAILED DESCRIPTION OF EXAMPLE EMBODIMENTS

Figure 5:
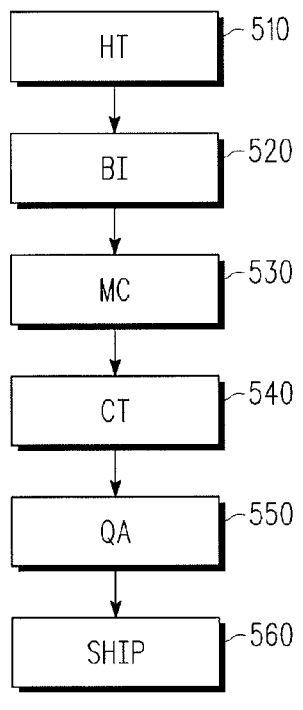
FIG. 5 is a flow diagram illustrating processes included in a method of testing and conditioning an assembled MRAM device according to an example embodiment.

The following detailed description of example embodiments is not intended to limit the invention or the application and uses of the invention. Furthermore, there is no intention to be bound by any expressed or implied theory presented in the preceding technical field, background, or the following detailed description of example embodiments. Furthermore, other desirable features and characteristics of the invention will become apparent from the subsequent detailed description and the appended claims, taken in conjunction with the accompanying drawings and the foregoing technical field and background.

For simplicity and clarity of illustration, the drawing figures illustrate the general manner of construction, and descriptions and details of well-known features and techniques may be omitted to avoid unnecessarily obscuring aspects of the invention. Additionally, elements in the drawings figures are not necessarily drawn to scale. For example, the dimensions of some of the elements or regions in some of the figures may be exaggerated relative to other elements or regions of the same or other figures to help improve understanding of the example embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises, includes, or has a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the example embodiments described herein may be used, for example, in other orientations than those illustrated or otherwise described herein.

In accordance with various embodiments, through the careful balancing of temperature and magnetic fields applied to the MRAM array, the stuck-at-mid condition that is present in some bits can be eliminated without causing other bits in the MRAM array to develop the same stuck-at-mid condition. According to example embodiments, an elevated thermal energy beyond a maximum specification limit may be applied to a stuck-at-mid MTJ bit.

Concurrently with the application of the elevated thermal energy, according to example embodiments a supply voltage $V_{DD}$ may be applied to the array that is less than a voltage that causes the stuck-at-mid condition. The voltage that causes the stuck-at-mid condition is typically greater than the maximum specified supply voltage for the array. Thus, according to preferred embodiments, the supply voltage $V_{DD}$ is substantially equal to the maximum specified supply voltage, but in other embodiments the supply voltage may be greater than the maximum specified supply voltage. The magnitude of the current in the write lines is proportional to the magnitude of the supply voltage $V_{DD}$, and the magnitude of the magnetic field produced by the write lines is proportional to the current magnitude. Thus, the magnitude of the magnetic field is also proportional to the supply voltage $V_{DD}$.

According to some example embodiments, while the operating conditions of the array are maintained at the elevated temperature and the supply voltage $V_{DD}$, the entire array of bits is repeatedly cycled such that the MTJ bits without the stuck-at-mid condition are alternatingly placed in a first stable state and a second stable state. The first and second stable states may be, for example, a 0 and a 180 degree state. The MTJ bits with the stuck-at-mid condition are cycled in the same manner, but, as was explained above, the stuck-at-mid condition prevents those bits from achieving the 0 degree state or 180 degree stage. However, the elevated temperature of the array allows the unstable vortices in the stuck-at-mid bits to move more freely, while write cycling the entire array with a nominal, but high, magnetic field causes the stuck-at-mid bits to be shaken loose without causing other, good bits to develop the stuck-at-mid condition. Thus, the cycling described above can "break free" the MTJ bits that have the stuck-at-mid condition, allowing them to be placed in the 0 or 180 degree state.

According to example embodiments, the array of MTJ bits may be cycled between the first stable state and the second stable state for a first period of time. The first period of time is very dependent upon the conditions. Under perfect temperature and current conditions, it is feasible that the cycling time could be reduced to seconds. According to a presently preferred embodiment, the first period of time is approximately two hours.

According to other example embodiments, the array of MTJ bits may also be maintained in the first stable state or the second stable state for a second period of time during a static bake. Like the first period of time described above for the cycling of the array between the first and second stable states, the second period of time is also very dependent upon conditions. However, according to a presently preferred embodiment, the second period of time is approximately one hour. Of course, in alternative embodiments the first and second periods of time may be shortened or lengthened relative to the presently preferred embodiments.

FIG. 5 is a flow diagram illustrating processes included in a method 500 of testing and conditioning an assembled MRAM device according to an example embodiment. Compared to the conventional testing method of FIG. 4, in which method 500 includes similar steps HT 510, BI 520, CT 540, and QA 550, there is an additional Memory Conditioning (MC) process 530 that occurs between the Burn-In process 520 and the Cold Test process 540. In alternative embodiments, the MC process 530 may occur anytime between assembly and shipping 560 of the MRAM device, although immediately following the Burn-In process 520 is preferred because the equipment used to perform the Burn-In 520 may be conveniently used to perform the Memory Conditioning process 530.

Figure 6:
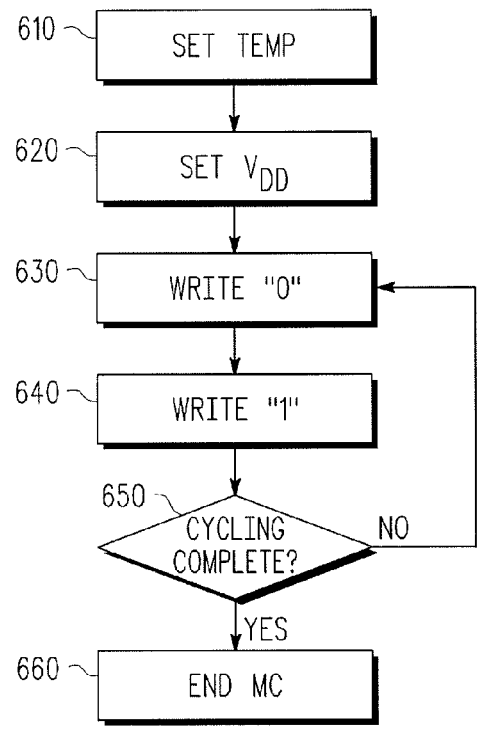
FIG. 6 is a flow diagram illustrating sub-processes that may be included in a memory conditioning process according to another example embodiment.

FIG. 6 is a flow diagram illustrating sub-processes that are included in a MC process 600 according to another example embodiment of the invention. The MC process 600 may be illustrative of the MC process 530 of FIG. 5.

Referring to FIG. 6, the temperature of an MRAM device is set to an elevated temperature above the maximum specified operating temperature of the MRAM device in sub-process 610. Next, in process 620, the supply voltage $V_{DD}$ is preferably set to a value that is approximately equal to a maximum specified supply voltage for the MRAM device. In alternative embodiments, the order in which the sub-processes 610 and 620 occur may be reversed. According to preferred embodiments, when the MC process 600 occurs immediately after a Burn-In process, such as Burn-In 520 of FIG. 5, the same test equipment used to perform the Burn-In may be used to set the supply voltage and temperature conditions for the MC process 600.

A typical Burn-In process 520 involves testing the MRAM devices at an elevated temperature compared to the maximum specified operating temperature and with an elevated supply voltage compared to the maximum specified supply voltage. However, as was explained above the elevated supply voltage used during the Burn-In may cause stuck-at-mid problems in the MRAM devices due to the larger magnetic fields generated. Therefore, according to example embodiments, the Burn-In test equipment may be configured to perform the MC process 600 by reducing the elevated supply voltage to approximately the maximum specified supply voltage.

Unlike the magnetic fields that are produced from the elevated supply voltage used during Burn-In 520, it was discovered that the magnetic fields produced using the maximum specified supply voltage are too weak to cause additional vortices from being formed, but nevertheless are strong enough to encourage vortices in any MTJ bits having the stuck-at-mid condition to be shaken loose.

After the temperature and the supply voltage $V_{DD}$ are set in subprocesses 610, 620, a first magnetic field is applied to the MRAM devices in process 630. The first magnetic field is capable of writing "0" to the MRAM devices that do not have a stuck-at-mid condition. Furthermore, due to the elevated temperature of the MRAM devices relative to the maximum specified operating temperature, the vortices present in any MRAM devices with the stuck-at-mid condition are more easily broken free from the unstable state by the first magnetic field.

Next, in sub-process 640, a second magnetic field is applied to the MRAM devices in process 640. The second magnetic field is capable of writing "1" to the MRAM devices that do not have the stuck-at-mid condition. Again, due to the elevated temperature of the MRAM devices, the unstable vortices present in any stuck-at-mid bits are more easily broken free by the second magnetic field. It should be apparent that the order of sub-processes 630 and 640 may be reversed.

After sub-process 640 is performed, it is determined in sub-process 650 whether the MRAM devices have been cycled for the desired amount of time or the desired number of cycles. If not, the sub-process 650 returns to sub-process 630, where the MRAM devices are again written with the first magnetic field. If the cycling of the MRAM devices is complete, the Memory Condition process 600 ends at sub-process 660. With each cycling of the MRAM devices, there is an increased chance that vortices in one or more of the MTJ bits having the stuck-at-mid problem will be eliminated, resulting in an improved device yield across the array.

Figure 7:
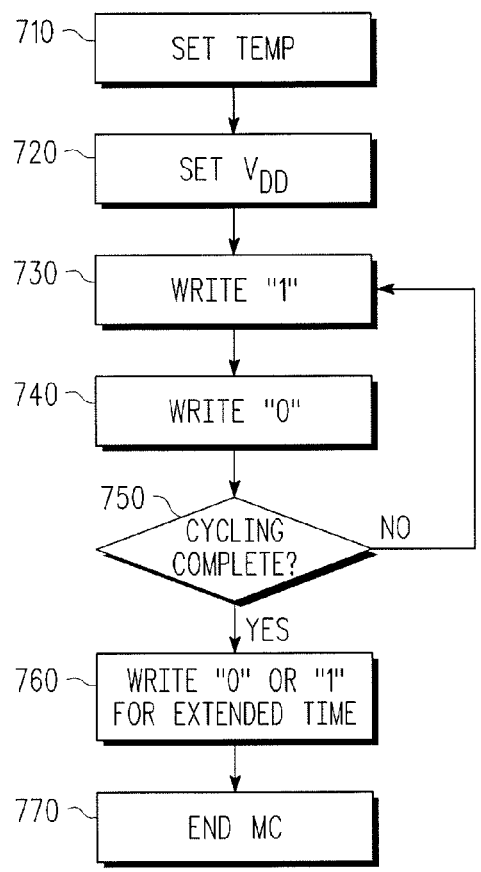
FIG. 7 is a flow diagram illustrating sub-processes that may be included in a memory conditioning process according to still another example embodiment.

FIG. 7 is a flow diagram illustrating sub-processes that are included in a MC process 700 according to still another example embodiment. The MC process 700 may be illustrative of the MC process 530 of FIG. 5. Since the sub-processes 710-750 of FIG. 7 are similar to the sub-processes 610-650 that were described above for FIG. 6, an unnecessarily repetitive description is omitted from the discussion of FIG. 7.

Compared to the example embodiment of FIG. 6, the example embodiment of FIG. 7 has an additional sub-process 760 where a magnetic field capable of writing a "0" or a "1" to MRAM devices without the stuck-at-mid condition is applied to all the MRAM devices for an extended period of time, without cycling between the two states. This extended period at which the MRAM devices are held at either a "1" or a "0" has also been found to be helpful in eliminating vortices in MTJ bits having the stuck-at-mid condition. According to MC process 700, the static sub-process 760 occurs immediately following the end of the cycling sub-processes 730-750 and prior to the ending of the sub-process 770, but in alternative embodiments the order of sub-process 760 relative to the sub-processes 730-750 may be reversed.

According to some example embodiments, the write cycles performed during sub-processes 730, 740, 750 occur for a first period of time, while the static bake represented by sub-process 760 occurs during a second period of time. It should be obvious that the chance of completely eliminating stuck-at-mid MTJ bits in the MRAM device array improves as the amount of time spent conditioning the MRAM devices according to example embodiments increases. However, the law of diminishing returns operates in this situation, and the inventors have found that performing memory conditioning on the MRAM devices for two to four hours is preferred. In a preferred example embodiment, the first time period for sub-processes 730, 740, 750 is approximately two hours, while the second time period for sub-process 760 is approximately one hour.

The actual values used for the elevated temperature relative to a maximum specified operating temperature and the maximum specified supply voltage will be, of course, dependent upon the material properties of the specific MRAM device that is memory conditioned according to example embodiments. For the particular MRAM devices that the inventors used to test the effectiveness of the example embodiments, for increased efficiency and a more streamlined flow process the elevated temperature was chosen to be 125° C. since this was the same temperature used during the Burn-In process that occurred immediately before the memory conditioning process. The supply voltage was selected to be approximately 3.6 V, as this was the upper limit of the supply voltage range listed in the specification for the particular MRAM device.

While the example embodiments described above alternately cycle between two memory states for a period of time, according to alternative embodiments of the invention the magnetic vortices may also be eliminated by repeatedly writing the same memory state over and over again. For example, repeatedly writing a "1" state or repeatedly writing a "0" state is also effective in eliminating magnetic vortices. The relative effectiveness between these different embodiments may vary depending on the particular construction of the MRAM device.

The invention may be practiced in many ways. What follows are exemplary, non-limiting descriptions of example embodiments. According to an example embodiment, a method of clearing stuck-at-mid bits from an array of Magnetic Tunnel Junction (MTJ) bits that includes bits with a stuck-at-mid condition and bits without the stuck-at-mid condition includes the steps of maintaining a state of an operating environment of the array such that a temperature of the array is greater than a maximum specified operating temperature and a supply voltage of the array is less than a voltage that causes the stuck-at-mid condition. The method further includes, while maintaining the state of the operating environment at the temperature and the supply voltage, cycling the array of MTJ bits such that the other bits without the stuck-at-mid condition are alternately placed in a 0° state and 180° state.

According to an example embodiment, the method further includes performing a burn-in test on the array prior to cycling the array of MTJ bits, the burn-in test performed at an elevated temperature relative to the maximum specified operating temperature and at an elevated supply voltage relative to a maximum specified supply voltage. Cycling the array of MTJ bits may begin substantially immediately after performing the burn-in test. Maintaining the state of the operating environment and cycling the array of MTJ bits may be preformed using substantially the same equipment that is used to perform the burn-in test. Furthermore, the temperature of the array may be substantially the same as the elevated temperature.

According to an example embodiment, the method further includes, while maintaining the state of the operating environment, operating the array of MTJ bits such that the bits without the stuck-at-mid condition are maintained in one of the 0° or 180° states. Cycling the array of MTJ bits and operating the array of MTJ bits may occur sequentially during a time period that is no greater than three hours.

According to an example embodiment, a method includes applying a magnetic field to an array of Magnetic Tunnel Junction (MTJ) bits, a magnitude of the magnetic field sufficient to eliminate a stuck-at-mid condition exhibited by one of the MTJ bits without causing other ones of the MTJ bits to develop the stuck-at-mid condition. The method may further include, while applying the magnetic field, maintaining a temperature of the array such that it is greater than a maximum specified operating temperature of the MTJ bits.

According to an example embodiment, applying the magnetic field includes operating the array of MTJ bits such that the other ones of the MTJ bits are placed in a first stable state, and operating the array of MTJ bits such that the other ones of the MTJ bits are placed in a second stable state. Applying the magnetic field may further include operating the array of MTJ bits such that the other ones of the MTJ bits are cycled between the first stable state and the second stable state for a first period of time. Applying the magnetic field may further include operating the array of MTJ bits such that the other ones of the MTJ bits are maintained in the first stable state for a second period of time. Applying the magnetic filed may also include operating the array of MTJ bits such that the other ones of the MTJ bits are repeatedly placed in a first stable state without being placed in a second stable state between the repetitions.

According to an example embodiment, a computer program product encoded in one or more tangible media for execution, is operable, when executed, to condition a Magnetic Random Access Memory (MRAM) device having a Magnetic Tunnel Junction (MTJ) that exhibits a stuck-at-mid condition by breaking free an unstable vortex in a free magnetic layer of the MTJ such that the MTJ is capable of being stably aligned in a 0° or 180° state. Breaking free the unstable vortex may include applying a magnetic field to the MTJ while the MRAM device is at an operating temperature that is greater than a maximum specified operating temperature and while the MRAM device is provided a supply voltage that is less than a voltage that causes the stuck-at-mid condition to develop.

According to an example embodiment, applying the magnetic field to the MTJ includes operating the MRAM device in a first manner such that the MRAM device would be placed in a stable 0° state if the MTJ did not have the stuck-at-mid condition,operating the MRAM device in a second manner such that it would be placed in a stable 180° state if the MTJ did not have the stuck-at-mid condition, and repetitively operating the MRAM device in the first manner and the second manner for a first period of time. Applying the magnetic field to the MTJ further may further include operating the MRAM device in the first manner for a second period of time during which the MRAM device is not operated in the second manner. The second period of time may occur after the first period of time.

According to an example embodiment, the computer program product is operable, when executed, to perform a burn-in test on the MRAM device using the burn-in test equipment prior to breaking free the unstable vortex. Performing the burn-in test may include applying a magnetic field to the MTJ while the operating temperature of the MRAM device is greater than the maximum specified operating temperature and while the MRAM device is provided a supply voltage that is greater than the maximum specified supply voltage for the MRAM device.

While at least one example embodiment has been presented in the foregoing detailed description, it should be appreciated that a vast number of variations exist, especially with respect to choices of device types and materials and the sequence of processes. The above-described invention is especially useful for the memory conditioning of MRAM devices, but persons of skill in the art will understand based on the description herein that other types of devices may be improved using the concepts taught herein. For example, the inventive principles taught by the example embodiments could be applied to other devices having magnetic layers where the elimination of unstable vortices in the magnetic layers would improve the performance of the device.

It should be emphasized that the example embodiments described above are only examples, and are not intended to limit the scope, applicability, or configuration of the invention in any way. Rather, the detailed description of the example embodiments provides those skilled in the art with a convenient road map for implementing the inventive principles contained in the example embodiments. The inventors regard the subject matter of the invention to include all combinations and subcombinations of the various elements, features, functions and/or properties disclosed herein.

It also should be understood that various changes can be made in the function and arrangement of elements without departing from the scope of the invention as set forth in the appended claims and the legal equivalents thereof.

The invention claimed is:

1. In an array of magnetic tunnel junction bits that includes first bits with a stuck-at-mid condition and second bits without the stuck-at-mid condition, the method comprising the steps of:
   exposing the array of magnetic tunnel junction bits to a cycling temperature that is greater than a maximum specified operating temperature;
   applying a cycling voltage to the array of magnetic tunnel junction bits that is less than an operating voltage that caused the stuck-at-mid condition of the first bits; and
   while maintaining the the cycling temperature and the cycling voltage, cycling the array of magnetic tunnel junction bits such that the first bits with the stuck-at-mid condition are alternatingly placed in a first stable state and a second stable state.

2. The method of claim 1, further comprising performing a burn-in test on the array prior to cycling the array of magnetic tunnel junction bits, the burn-in test performed at an elevated temperature relative to the maximum specified operating temperature and at an elevated supply voltage relative to a maximum specified supply voltage.

3. The method of claim 2, wherein cycling the array of magnetic tunnel junction bits begins substantially immediately after performing the burn-in test.

4. The method of claim 2, wherein the exposing, applying, cycling, and performing steps are each performed using burn-in test equipment.

5. The method of claim 4, wherein the cycling temperature of the array is substantially the same as the elevated temperature.

6. The method of claim 5, further comprising: while maintaining the cycling temperature and cycling voltage, operating the array of magnetic tunnel junction bits such that the second bits without the stuck-at-mid condition are maintained in one of the first or second stable states.

7. The method of claim 6, wherein cycling the array of magnetic tunnel junction bits and operating the array of magnetic tunnel junction bits occurs sequentially during a time period that is no greater than three hours.

8. A method comprising applying a magnetic field to an array of magnetic tunnel junction bits, a magnitude of the magnetic field sufficient to eliminate a stuck-at-mid condition exhibited by one of the magnetic tunnel junction bits without causing other ones of the magnetic tunnel junction bits to develop the stuck-at-mid condition.

9. The method of claim 8, further comprising, while applying the magnetic field, maintaining a temperature of the array such that it is greater than a maximum specified operating temperature of the magnetic tunnel junction bits.

10. The method of claim 9, wherein applying the magnetic field comprises:
    operating the array of magnetic tunnel junction bits such that the other ones of the magnetic tunnel junction bits are placed in a first stable state; and
    operating the array of MTJ bits such that the other ones of the magnetic tunnel junction bits are placed in a second stable state.

11. The method of claim 10, wherein applying the magnetic field further comprises operating the array of magnetic tunnel junction bits such that the other ones of the magnetic tunnel junction bits are cycled between the first stable state and the second stable state for a first period of time.

12. The method of claim 11, wherein applying the magnetic field further comprises operating the array of magnetic tunnel junction bits such that the other ones of the magnetic tunnel junction bits are maintained in the first stable state for a second period of time.

13. The method of claim 9, wherein applying the magnetic field comprises operating the array of magnetic tunnel junction bits such that the other ones of the magnetic tunnel junction bits are repeatedly placed in the first stable state without being placed in the second stable state.

14. A computer program product encoded in one or more tangible media for execution and when executed operable to condition a magnetic random access memory device having a magnetic tunnel junction that exhibits a stuck-at-mid condition by breaking free an unstable vortex in a free magnetic layer of the magnetic tunnel junction such that the magnetic tunnel junction is capable of being stably aligned in a first stable state or a second stable state.

15. The computer program product of claim 14, wherein breaking free the unstable vortex comprises applying a magnetic field to the magnetic tunnel junction while the magnetic random access memory device is at an operating temperature that is greater than a maximum specified operating temperature and while the magnetic random access memory device is provided a cycling voltage that is less than a voltage that causes the stuck-at-mid condition to develop.

16. The computer program product of claim 15, wherein applying the magnetic field to the magnetic tunnel junction comprises:

operating the magnetic random access memory device in a first manner such that the magnetic random access memory device would be placed in a first stable state if the magnetic tunnel junction did not have the stuck-at-mid condition;

operating the magnetic random access memory device in a second manner such that it would be placed in a second stable state if the magnetic tunnel junction did not have the stuck-at-mid condition; and repetitively operating the magnetic random access memory device in the first manner and the second manner for a first period of time.

17. The computer program product of claim 16, wherein applying the magnetic field to the magnetic tunnel junction further comprises operating the magnetic random access memory device in the first manner for a second period of time during which the magnetic random access memory device is not operated in the second manner.

18. The computer program product of claim 17, the second period of time occurring after the first period of time.

19. The computer program product of claim 18, further comprising performing a burn-in test on the magnetic random access memory device using burn-in test equipment prior to breaking free the unstable vortex.

20. The computer program product of claim 19, wherein performing the burn-in test comprises applying a magnetic field to the magnetic tunnel junction while the operating temperature of the magnetic random access memory device is greater than the maximum specified operating temperature and while the magnetic random access memory device is provided a cycling voltage that is greater than the maximum specified supply voltage for the magnetic random access memory device.

* * * * *